(12) United States Patent
Otsu et al.

(10) Patent No.: US 7,004,776 B2
(45) Date of Patent: Feb. 28, 2006

(54) ZIF CONNECTOR AND SEMICONDUCTOR-TESTING APPARATUS USING THE SAME

(75) Inventors: Akihiko Otsu, Kanagawa (JP); Keiichi Azuma, Kanagawa (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 10/972,409

(22) Filed: Oct. 26, 2004

(65) Prior Publication Data

US 2005/0142918 A1 Jun. 30, 2005

(30) Foreign Application Priority Data

Oct. 27, 2003 (JP) .............................. 2003-366721

(51) Int. Cl.
*H01R 11/22* (2006.01)
(52) U.S. Cl. .................................................... 439/266
(58) Field of Classification Search ................ 439/266, 439/267, 259, 260
See application file for complete search history.

(56) References Cited

U.S. PATENT DOCUMENTS

| | | | |
|---|---|---|---|
| 4,060,300 A * | 11/1977 | Jayne et al. ................ | 439/267 |
| 4,275,944 A * | 6/1981 | Sochor ....................... | 439/267 |
| 4,468,073 A * | 8/1984 | Machcinski ................. | 439/266 |
| 4,504,101 A * | 3/1985 | Reimer ........................ | 439/59 |
| 4,553,803 A * | 11/1985 | Lapraik et al. ............. | 439/260 |
| 4,606,594 A * | 8/1986 | Grabbe et al. .............. | 439/267 |
| 4,695,111 A * | 9/1987 | Grabbe et al. .............. | 439/266 |
| 4,943,242 A * | 7/1990 | Frankeny et al. ............ | 439/65 |
| 5,160,275 A * | 11/1992 | Nakamura et al. .......... | 439/328 |
| 5,709,562 A * | 1/1998 | Kourimsky .................. | 439/267 |
| 6,213,804 B1 * | 4/2001 | Matsumura .................. | 439/267 |
| 6,416,342 B1 * | 7/2002 | Matsumura .................. | 439/267 |

FOREIGN PATENT DOCUMENTS

| | | |
|---|---|---|
| JP | 06-109805 | 4/1994 |
| JP | 07-072200 | 3/1995 |
| JP | 08-086831 | 4/1996 |
| JP | 11-251383 | 9/1999 |
| JP | 2000-081461 | 3/2000 |
| JP | 2000-121703 | 4/2000 |
| JP | 2000-241500 | 9/2000 |
| JP | 2001-033351 | 2/2001 |
| JP | 2002-031664 | 1/2002 |
| JP | 2003-050262 | 2/2003 |

* cited by examiner

*Primary Examiner*—Gary Paumen
(74) *Attorney, Agent, or Firm*—Rader, Fishman & Grauer PLLC

(57) ABSTRACT

There is provided a ZIF connector which can be connected with a connecting part readily, correctly and reliably and a semiconductor-testing apparatus with the ZIF connector. The connector (2) comprises: an opening (22) through which a plug (1) is inserted; and a plurality of opposing contacts (21A), (21B) inside the opening (22). The contacts (21A), (21B) are opened and closed by a contact open-and-close mechanism. A moving block (23) holding the contacts in a cantilever manner so that one end side of the contacts (21A), (21B) is open in a form of the character 'V'. A shell (24) for slidably housing the moving block with the contacts (21A), (21B). When the contact open-and-close mechanism moves the moving block (23) toward the opening (22), the one end side of the contacts is characterized in the 'V' shape, which slides on the paired inclined faces (25A), (25B) of a first guide block (25) so as to widen the distance between the contacts (21A), (21B).

17 Claims, 13 Drawing Sheets

Fig. 1 A
Fig. 1 B
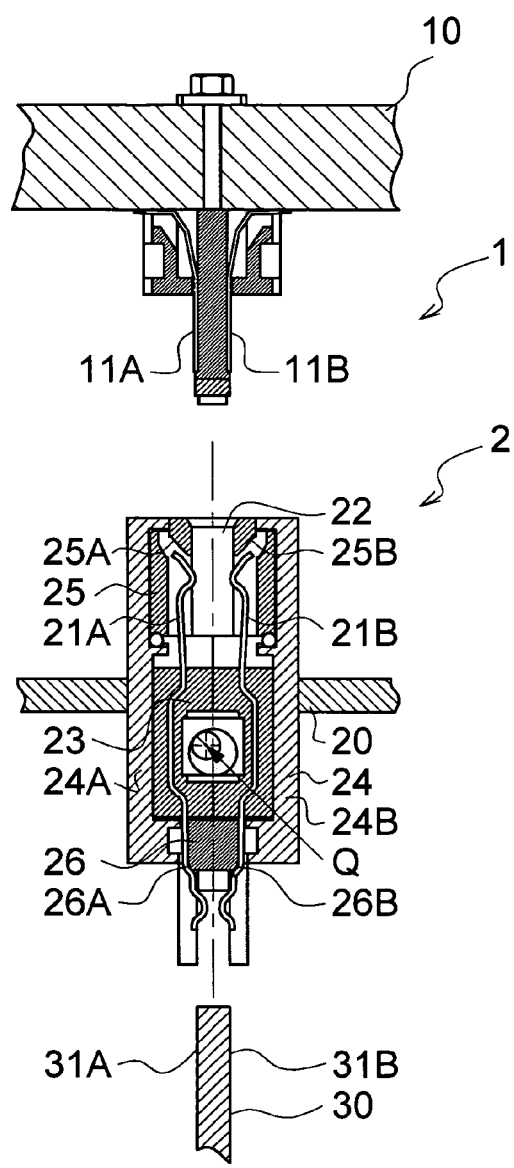
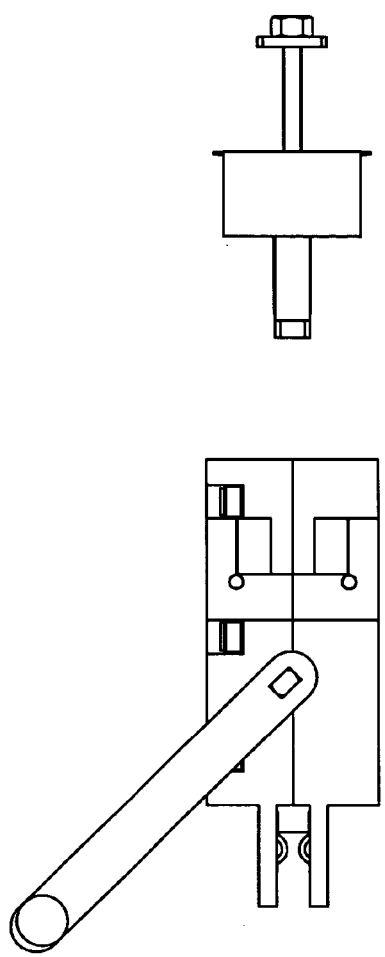

Fig. 3 D
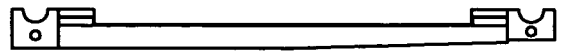
Fig. 3 B
Fig. 3 C
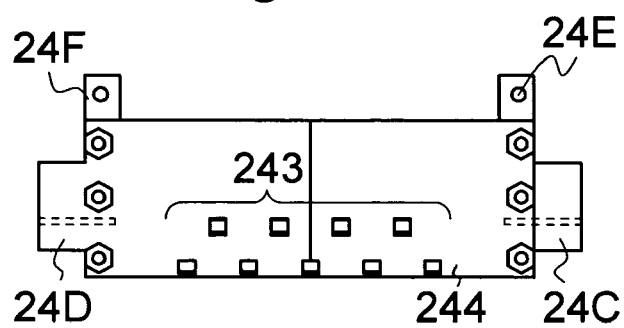
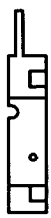
Fig. 3 A
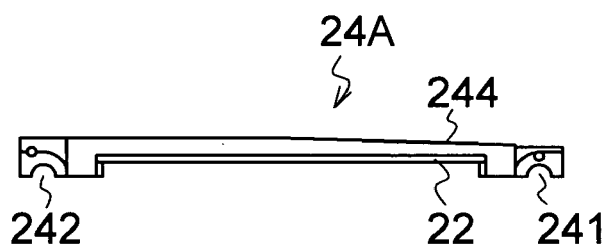
Fig. 3 F
Fig. 3 E
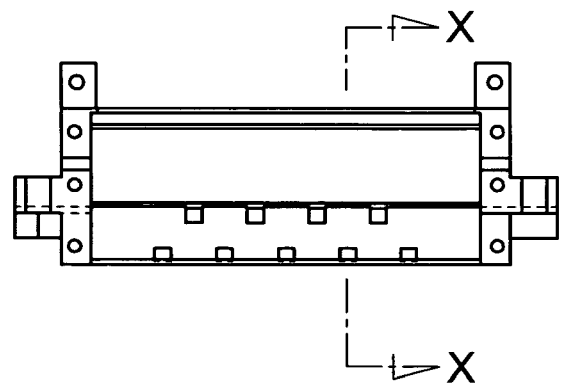

Fig. 4 D
Fig. 4 B          Fig. 4 C
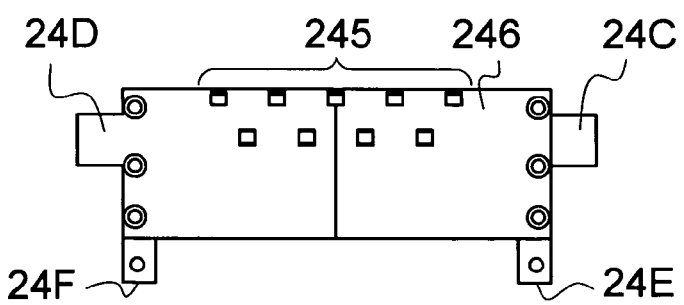
Fig. 4 A
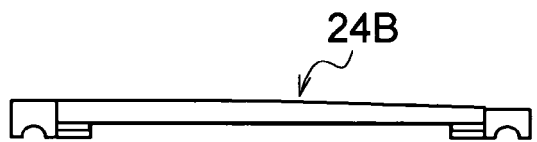
Fig. 4 F          Fig. 4 E
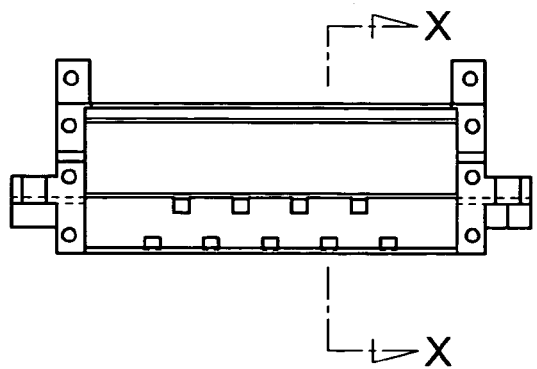

Fig. 5 B
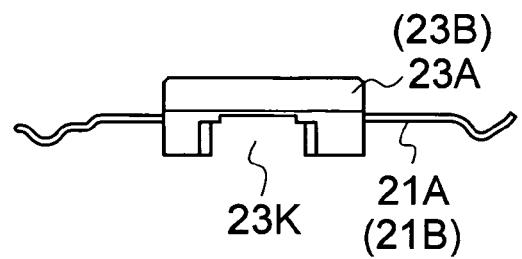
Fig. 5 C        Fig. 5 A
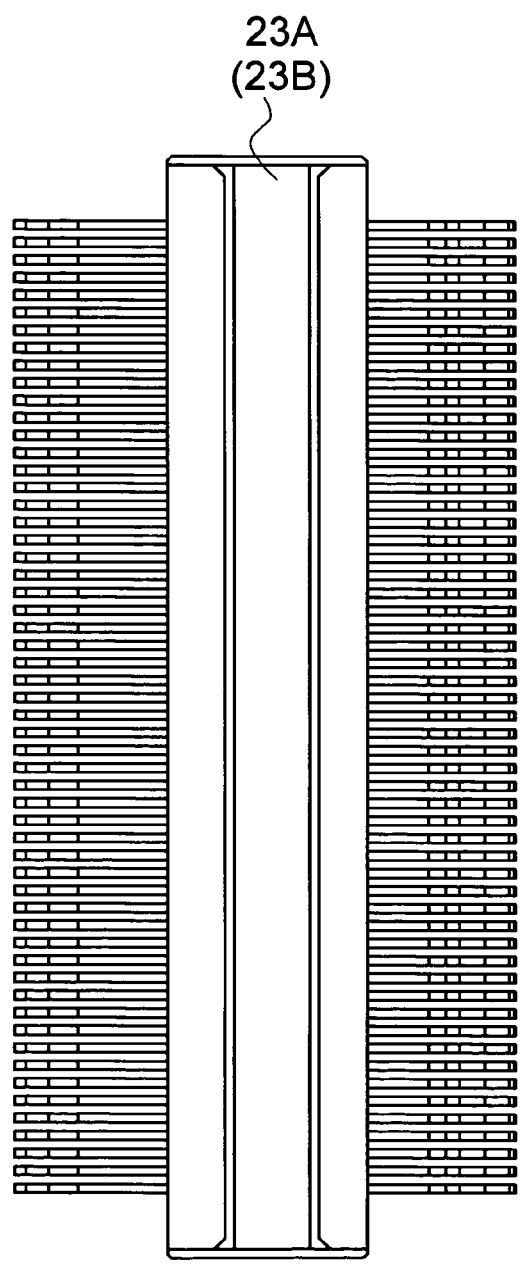

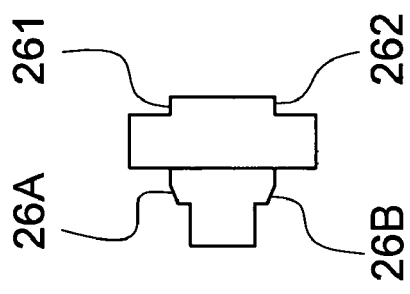
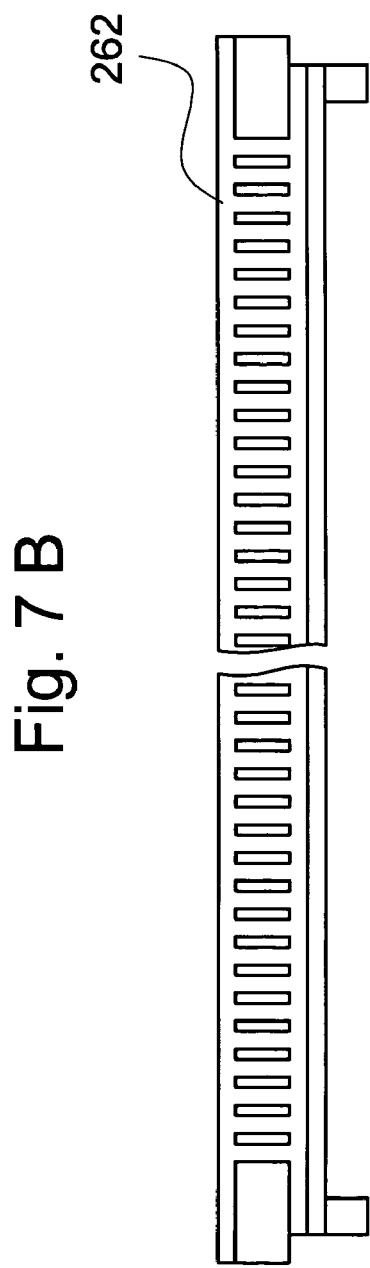
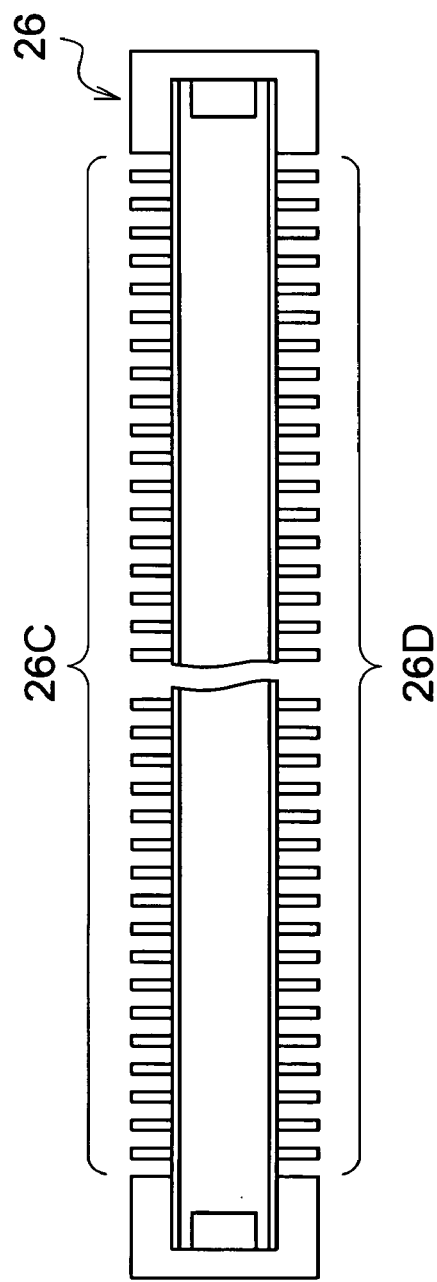

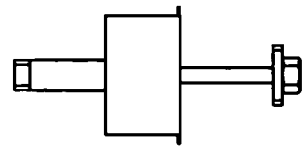
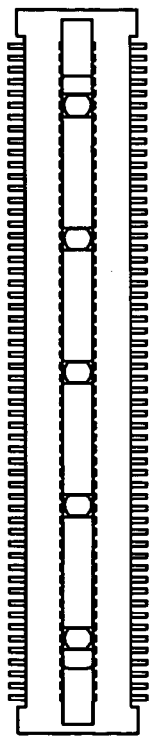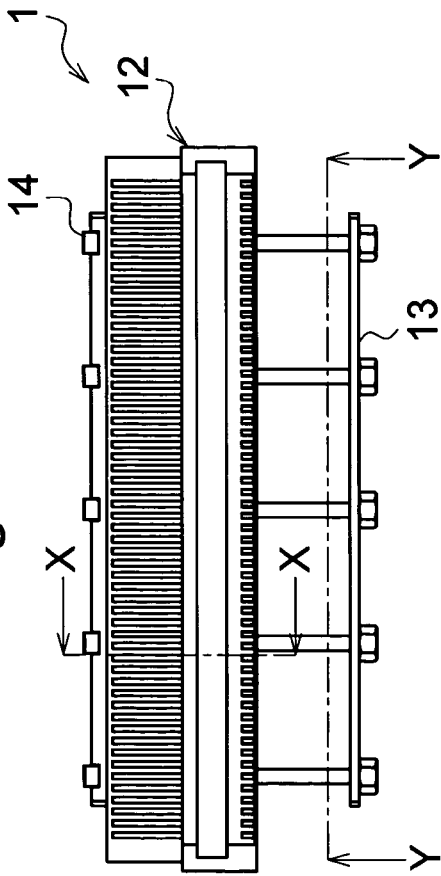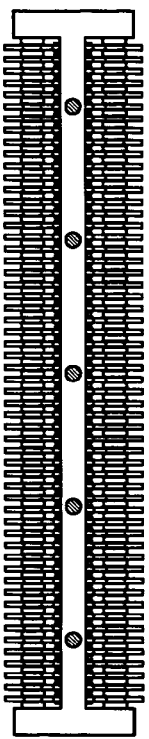
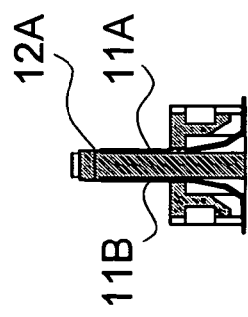

(a)

ZIF CONNECTOR AND SEMICONDUCTOR-TESTING APPARATUS USING THE SAME

CROSS-REFERENCE TO RELATED APPLICATIONS

This application is based upon and claims the benefits of priority from Japanese Patent Application No. 2003-366721 filed on Oct. 27, 2003, the entire contents of which are incorporated herein by reference.

FIELD OF THE INVENTION

The present invention relates to a ZIF (Zero Insertion Force) connector and a semiconductor-testing apparatus using the same. More specifically, it relates to a ZIF connector that hardly needs any force when a dual-in-line plug with two-line contacts is inserted and removed and a semiconductor-testing apparatus using the same.

RELATED ART

For example, a semiconductor-testing apparatus for testing semiconductor components, such as a packaged IC and a wafer includes a DUT board on which a DUT (Device Under Test) is set, or a testing head with a test board that is brought into contact with a DUT.

In regard to such semiconductor-testing apparatus, especially a memory-testing apparatus, a testing head in the memory-testing apparatus has a test board on which, for example, a lot of dual-in-line plugs for connection with DUTs are mounted for the purpose of testing the DUTs collectively.

For instance, ninety six (96) dual-in-line plugs are mounted in a radial manner on a test board. Further, there is placed a fixture board between the test board and the testing head. On the fixture board, there are mounted connectors in a radial manner; the dual-in-line plugs are inserted into the corresponding connectors and electrically connected.

Since the test board is specific to the type of the DUTs that the board supports, it is necessary to demount the test board with dual-in-line plugs from the fixture board to mount another test board each time the type of DUTs is changed.

In recent years the dual-in-line plug in itself has been increased in the number of electric poles, and ZIF connectors which hardly require forces for inserting and removing the connector have been adopted as connectors for mechanically and electrically connecting with a plurality of dual-in-line plugs mounted on a test board.

As the above-described ZIF connector, there has been invented a ZIF connector which is operated by a connector guide having grooves and electrically connected with connecting parts targeted for connection (e.g. dual-in-line plugs) and which includes: contact pins to be connected with electric terminals of the connecting parts; a housing for holding the contact pins; pressing parts for pressing the contact pins against the electric terminals; handles for rotating the pressing parts; and handle-operating parts, each having at least a spherical surface portion in its outer surface, wherein each handle-operating part is to be connected with the leading end of the handle and engaged with the grooves (see JP-A-2000-81461 becoming Japanese Patent No. 3253602, for example).

The number of the pressing parts that the ZIF connector according to JP-A-2000-81461 has is at least two, and the pressing parts are provided bilaterally with respect to each contact pin. In addition, the ZIF connector is characterized in that each pressing part has a rotating cam and that the handle forces the rotating cam to rotate.

Further, each handle has a lever portion connected to the rotating cam and extending in a radial direction of the rotating cam and an elongated portion mounted on a leading end of the lever portion and extending in an axial direction of the rotating cam. The handle-operating part is provided on the leading end of the elongated portion and the handle is provided for each rotating cam.

With such ZIF connector, in the case where the pressing part does not press the corresponding contact pin, the distance between a central portion of the contact pin and the electric terminal is wider than the distance between a contact portion of the contact pin and the electric terminal; and the distance between a lower portion of the contact pin and the electric terminal, provided that the above distances are taken in a direction perpendicular to the axial direction of the connector. Therefore, the connector can be connected with a connecting part readily, correctly, and reliably.

However, the ZIF connector according to JP-A-2000-81461 includes two rotating cams to open and close opposing contacts and two handles to force the two rotating cams to rotate. If the connector is adapted so that opposing contacts can be opened and closed by one handle or lever instead of using two handles, the structure would be made simpler.

Further, in the ZIF connector according to JP-A-2000-81461, the two rotating cams are placed outside the opposing contacts, and the two rotating cams are covered by the housing from the outside thereof and as such, the ZIF connector has a large thickness. Therefore, if a structure such that the housing covers the opposing contacts from the outside thereof is adopted thereby to decrease the thickness of the ZIF connector, it would be possible to densely mount a lot of ZIF connectors, for example, on a fixture board.

Furthermore, the leading end of the opposing contacts of the ZIF connector are free end, and therefore pressing a middle portion between the free and fixed end of each contact may twist the leading end of the contact and interfere with proper connection with its mating contact in a narrow pitch contact arrangement.

In the case of a narrow pitch contact arrangement, if a mechanism such that opposing contacts can slide in a direction of inserting the opposing contacts is adopted to correctly guide the free leading end of the contacts, the connection would be made more reliable.

Such ZIF connector has one end provided with an opening into which the mating connector is to be inserted and the other end opposite from the one end, wherein the other end may be connected with, for example, a printed circuit board such that edge connectors usable as external connection terminals are provided on its up and down surfaces.

A printed circuit board with edge connectors on its up and down surfaces like this may be arranged so that opposing contacts can be brought into or out of contact with the edge connector in response to opening and closing operations of the opposing contacts without bonding fixed end of the opposing contacts to the edge connector, namely without bonding the contacts to the printed circuit board. A printed circuit board arranged so can offer convenience not only in a soldering process can be omitted, but also in the ZIF connector can be easily separated from the printed circuit board, for example, during a maintenance work.

SUMMARY OF THE INVENTION

According to the present invention, it is an object to provide a ZIF connector which enables simple, correct, and reliable connection with a connecting part and a semiconductor-testing apparatus using such ZIF connector.

In order to achieve the object, the inventor invented: a novel ZIF connector to be described below having a structure such that opposing contacts are opened and closed by sliding the opposing contacts in a direction of insertion thereof; and a semiconductor-testing apparatus using such ZIF connector.

(1) A ZIF connector having an opening formed in its one end, in which a dual-in-line plug with two-line first contacts is to be inserted; opposing second contacts inside the opening; and a contact open-and-close mechanism for opening the second contacts when a dual-in-line plug is inserted into or drawn from the opening, the second contacts to be electrically connected with the first contacts when the contact open-and-close mechanism closes the second contacts with a dual-in-plug inserted in the opening; an insulative moving block cantilevering the opposing second contacts so that one end of the second contacts can form an opening V-shaped in section, and moved forward and backward with respect to the opening by the contact-opening mechanism; a shell slidably housing the moving block with the second contacts; and a first insulative guide block attached on the entrance of the opening and having a pair of inclined faces formed in positions opposite from each other, the pair of inclined faces having a certain inclination angle so that the distance therebetween gradually widens from inside the opening toward outside the opening, the pair of inclined faces guiding the one end of the second contacts, wherein when contact open-and-close mechanism moves the moving block with the second contacts toward the entrance side of the opening, the opposing one end of the second contacts slide on the pair of inclined faces of the first guide block, making the opposing distance between the one end of the second contacts larger than the distance between the first contacts.

(2) The ZIF connector according to (1) capable of holding a printed circuit board, which has edge connectors making external connection terminals on its front and rear surfaces, in the other end opposite from the one end where the opening is formed, including: third contacts to be electrically connected with the edge connectors, the opposing third contacts cantilevered by the moving block so that the opposing other end of the third contacts protrude from the shell and the opposing other end can be closed in a form of the character V, and a second insulative guide block attached on the side of the other end opposite from the opening and having a pair of inclined faces formed in positions opposite from each other, the pair of inclined faces having a certain inclination angle so that the distance therebetween gradually widens from outside the other end toward inside the other end, the pair of inclined faces guiding the other end of the third contacts, wherein when the contact open-and-close mechanism moves the moving block with the third contacts toward the opening, the opposing other end of the third contacts slide on the pair of inclined faces of the second guide block and then the opposing other end of the third contacts, which have been in contact with the edge connectors, are opened so that they are spaced away from the edge connectors, and the second contact and the third contact located corresponding to the second contact in longitudinal position form a single contact, a substantially central portion of which is embedded in the moving block.

(3) The ZIF connector according to (1) or (2), wherein the moving block has a rectangular through-hole formed in parallel with the direction in which the second contacts are arranged, the contact open-and-close mechanism has: a cam unit including the moving block and an eccentric cam inserted in the rectangular through-hole; and a lever attached on an axial end of a rotation axis of the eccentric cam protruding from the shell, and the contact open-and-close mechanism moves the moving block forward and backward when the lever is swung.

(4) The ZIF connector according to (1) or (2), wherein the first guide block has a plurality of first pectinated grooves formed in the pair of inclined faces thereof for guiding the opposing one end of the second contacts.

(5) The ZIF connector according to (2), wherein the second guide block has: a pair of outer walls against which the opposing other end of the third contacts abut; and a plurality of second pectinated grooves formed in the pair of outer walls, for guiding the opposing other end of the third contacts.

(6) The ZIF connector according to any one of (1) to (3), wherein the moving block with the second contacts is composed of two moving block parts so that the opposing second contacts are placed in a line-symmetrical relation.

(7) The ZIF connector according to (6), wherein each moving block part is provided with the second contacts by molding.

(8) The ZIF connector according to (6) or (7), wherein the moving block parts with the second contacts are combined and then slidably housed by the shell, inside the split rectangular through-hole, a pair of long plates is placed so that the paired long plates cover opposing inner walls of the through-hole in a direction perpendicular to the direction of the movement of the moving block, and the eccentric cam is slidably coupled to the long plates placed oppositely.

(9) The ZIF connector according to any one of (1) to (3), wherein the shell is split into fist and second sub-shells so that the first and second sub-shells are half of the thickness of the shell.

(10) The ZIF connector according to (9), wherein the first guide block has a plurality of protrusions formed on opposing outer walls thereof, the first and second sub-shells each have a plurality of holes formed therein, the holes running from an opposing inner wall of each of the first and second sub-shells to its outer surface therethrough, and when the plurality of holes formed in the first and second sub-shells are mated with the corresponding protrusions of the first guide block, the first and second sub-shells are combined into the shell which holds the first guide block.

(11) The ZIF connector according to (9), wherein the shell produced by combining the first and second sub-shells has sloping portions respectively formed in the opposing outer walls so that one end of the shell is smaller than the other end in thickness.

(12) A semiconductor-testing apparatus with a testing head, comprising: a test board placed on an upper portion of the testing head and having a plurality of the dual-in-line plugs mounted thereon; and a fixture board placed between the test board and the testing head and having the ZIF connectors according to any one of (1) to (3) mounted thereon, wherein the test board with dual-in-line plugs is to be mounted on and demounted from the fixture board with ZIF connectors.

(13) The semiconductor-testing apparatus with a testing head according to (12), wherein the fixture board has a plurality of the ZIF connectors according to claim 11 mounted in a radial pattern (or in a radial manner) in a central portion thereof, and each shell is placed on the fixture board with one end of a smaller thickness pointed toward the center of the radial pattern and the other end of a larger thickness pointed toward the circumference of the pattern.

According to the present invention of (1), the ZIF connector has an opening formed in its one end, in which a dual-in-line plug with two-line first contacts is to be inserted. Also, the ZIF connector has opposing second contacts inside the opening. When a dual-in-line plug is inserted into or drawn from the opening, the contact open-and-close mechanism opens the second contacts. Also, when the contact open-and-close mechanism closes the second contacts with a dual-in-line plug inserted in the opening, the second contacts is electrically connected with the first contacts of the plug. The insulative moving block cantilevers the opposing second contacts so that one end of the second contacts can form an opening V-shaped in section, and is moved forward and backward with respect to the opening by the contact-opening mechanism. The shell slidably houses the moving block with second contacts. The first insulative guide block is attached on the entrance of the opening and has a pair of inclined faces formed in positions opposite from each other. The pair of inclined faces has a certain inclination angle so that the distance therebetween gradually widens from inside the opening toward outside the opening. The pair of inclined faces guides the one end of the second contacts. When contact open-and-close mechanism moves the moving block with the second contacts toward the entrance side of the opening, the opposing one end of the second contacts slide on the pair of inclined faces of the first guide block, making the opposing distance between the one end of the second contacts larger than the distance between the first contacts.

Here, in the case where the opening is referred to as a first opening, a structure including the shell having the first opening, the moving block, the contact open-and-close mechanism, the first guide block may be referred to as a connector element. With such connector element, the second or third contacts (in the case where contacts to be brought into contact with edge connectors are referred to as third contacts) held by the moving block may be connected with a dual-in-line plug or connector terminals. In addition, a plurality of such connector elements may be arrayed in a line to form a ZIF connector. The second or third contacts may have respective extending portions and each of the second or third contacts may have a sliding portion in a leading end or middle position of the extending portion. The sliding portion may be of a desired form, such as a curved surface, or an inclined face, and more preferably the sliding portion has a form of an inclined face. The inclined faces of the first block may have a predetermined angle with respect to one of the direction of inserting and removing of a dual-in-line plug or the like so that the sliding portions can slide on the faces.

While the predetermined angle can be selected appropriately so that preferable opening and closing of the second or third contacts (i.e. preferable operations for widening and narrowing the distance between the contacts) are carried out, the predetermined angle may be, for example, about 45 degrees. Further, when force are required to open the second or third contacts, it is preferable that the predetermined angle is an angle smaller than 45 degrees, and the predetermined angle may be, for example, about 30 degrees.

According to the present invention of (2), the ZIF connector holds a printed circuit board, which has edge connectors making external connection terminals on its front and rear surfaces, in the other end of the ZIF connector opposite from the one end where the opening is formed. Then, the third contacts are electrically connected with the edge connectors. The second insulative guide block is attached on the side of the other end opposite from the opening and has a pair of inclined faces formed in positions opposite from each other. The pair of inclined faces has a certain inclination angle so that the distance therebetween gradually widens from outside the other end toward inside the other end and guides the other end of the third contacts. The moving block cantilevers the third contacts so that the opposing other end of the third contacts protrude from the shell and the opposing other end can be closed in a form of the character V. When the contact open-and-close mechanism moves the moving block with the second contacts toward the entrance of the opening, the opposing other end of the third contacts slide on the pair of inclined faces of the second guide block and then the opposing other end of the third contacts, which have been in contact with the edge connectors, are opened so that they are spaced away from the edge connectors.

According to the present invention of (3), the ZIF connector includes a contact open-and-close mechanism. The moving block has a rectangular through-hole formed in parallel with the direction in which the third contacts are arranged. In the rectangular through-hole, there is inserted an eccentric cam. The moving block and the eccentric cam form a cam unit. Moreover, the rotation axis of the eccentric cam protrudes from the shell, and a lever is attached on an axial end of the rotation axis. When the lever is swung, the contact open-and-close mechanism moves the moving block forward and backward.

The rotation axis is rotatably fixed by a bearing provided in the shell. The through-hole may be provided so that a central portion of the moving block is hollowed out. The direction of the through-hole can stand for the direction in which the hole is piercing.

According to the present invention of (4), the first guide block has a plurality of first pectinated grooves formed respectively in the paired inclined faces for guiding the opposing one end of the second contacts. In other words, the first grooves correctly guide the opposing one end of the second contacts.

The plurality of first pectinated grooves are formed into rectangular reentrants and protrusions so that the grooves each form a compartment for a connector element when viewed from one of the direction of inserting and removing. Therefore, walls on both the sides of each connector element serve to limit deformation of the second or third contacts accommodated in the compartment so as to prevent the contacts from sticking out from a space defined for the respective connector element.

According to the present invention of (5), the second guide block has: a pair of outer walls against which the opposing other end of the third contacts abut; and a plurality of second pectinated grooves formed in the pair of outer walls, for guiding the opposing other end of the third contacts. In other words, the second grooves correctly guide the opposing other end of the third contacts.

According to the present invention of (6), the moving block with the second contacts is composed of two moving block parts so that the opposing second contacts are placed in a line-symmetrical relation. According to the present invention of (7), each moving block part is provided with the second contacts by molding.

The moving block for holding the second and third contacts can be split into two parts as described above. Reversely, it is also possible to assemble two dividing parts into the moving block. The second contact and the third contact located corresponding to the second contact in longitudinal position may form a single contact, a substantially central portion of which is embedded in the moving block. In addition, the second and third contacts placed so as to pinch the dual-in-line plug or the like can be separated from the respective mating targets and held in the respective dividing parts of the moving block. The splitting plane may be substantially in parallel with the direction of the through-hole piercing and substantially in parallel with the direction of inserting and removing.

According to the present invention of (8), the moving block parts with the second contacts are combined and then slidably housed by the shell, inside the split rectangular through-hole, a pair of long plates is placed so that the paired long plates cover opposing inner walls of the through-hole in a direction perpendicular to the direction of the movement of the moving block, and the eccentric cam is slidably coupled to the long plates placed oppositely. In other words, the moving block parts with the second contacts are not moved independently of each other but moved in one united form.

According to the present invention of (9), the shell is split into fist and second sub-shells (i.e. dividing parts or split shell parts) so that the first and second sub-shells are half of the thickness of the shell. According to the present invention of (10), the first guide block has a plurality of protrusions formed on opposing outer walls thereof, and the first and second sub-shells each have a plurality of holes formed therein, the holes running from an opposing inner wall of each of the first and second sub-shells to its outer surface therethrough. When the plurality of holes formed in the first and second sub-shells are mated with the corresponding protrusions of the first guide block, the first and second sub-shells are combined into the shell which holds the first guide block.

The through-holes of the shell part may be referred to as fitting holes which are to be engaged with protrusions on the first guide block.

According to the present invention of (11), the shell produced by combining the first and second sub-shells has sloping portions respectively formed in the opposing outer walls so that one end of the shell is smaller than the other end in thickness.

According to the present invention of (12), the semiconductor-testing apparatus includes a testing head. Further, on a test board placed on an upper portion of the testing head is mounted a plurality of the dual-in-line plugs. On a fixture board placed between the test board and the testing head, there are mounted the ZIF connectors according to any one of (1) to (3). Then, the test board with dual-in-line plugs is to be mounted on and demounted from the fixture board with ZIF connectors.

According to the present invention of (13), the semiconductor-testing apparatus includes a testing head wherein the fixture board has a plurality of the ZIF connectors mounted in a radial pattern (or in a radial manner) in a central portion thereof, and each shell is placed on the fixture board with one end of a smaller thickness pointed toward the center of the radial pattern and the other end of a larger thickness pointed toward the circumference of the pattern. Such semiconductor-testing apparatus allows more ZIF connectors to be mounted on a fixture board in a radial pattern (or in a radial manner) in comparison to a conventional semiconductor-testing apparatus.

A semiconductor-testing apparatus according to the present invention may be provided with, e.g. a mechanism capable of swinging at a time a plurality of levers included in ZIF connectors placed in a radial pattern (or in a radial manner) thereby to facilitate mounting or removing a test board.

A ZIF connector according to the present invention can be manufactured readily because the ZIF connector is arranged so that opposing contacts can be opened and closed by one lever. Further, a structure such that the outside of the opposing contacts is covered by a housing is adopted to reduce the thickness of the ZIF connector. As a result, lots of ZIF connectors can be mounted on e.g. a fixture board more densely.

With such ZIF connector, in the other end opposite from the one end with an opening for insertion of a connector to be mated is provided a printed circuit board having edge connectors making external connection terminals on its front and rear surfaces.

A ZIF connector with a printed circuit board like this is useful because it adopts an arrangement such that opposing contacts are brought into contact with or separated from the edge connectors in response to the operation of closing or opening the opposing contacts, which makes possible to not only omit a soldering process but also separate the printed circuit board from the ZIF connector easily, for example, in maintenance.

Further features of the present invention, its nature, and various advantages will be more apparent from the accompanying drawings and the following detailed description of the present invention.

BRIEF DESCRIPTION OF THE DRAWINGS

FIGS. 1A and 1B are views showing an embodiment of a ZIF connector according to the present invention, in which FIG. 1A is a cross-sectional view and FIG. 1B is a side view.

FIGS. 3A–3F are views showing a structure of a first sub-shell according to the present invention.

FIGS. 4A–4F are views showing a structure of a second sub-shell according to the present invention.

FIGS. 5A–5C are views showing a moving block with contacts according to the present invention.

FIGS. 7A–7C are views showing a structure of second guide block according to the present invention.

FIGS. 8A–8E are views showing a structure of the dual-in-line plug illustrated in FIGS. 1A and 1B.

DESCRIPTION OF THE PREFERRED EMBODIMENT

Figure 2:
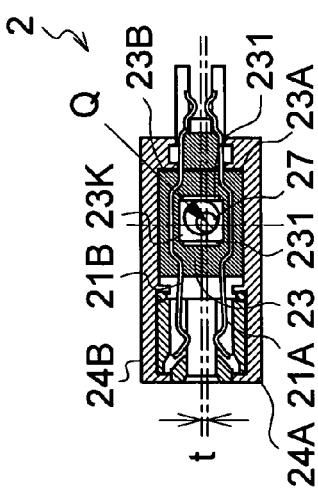
FIGS. 2A–2D are views showing a structure of the ZIF connector according to the present invention.
Figure 2:
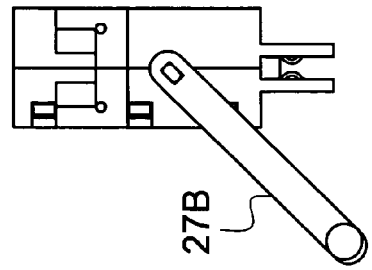
Figure 2:
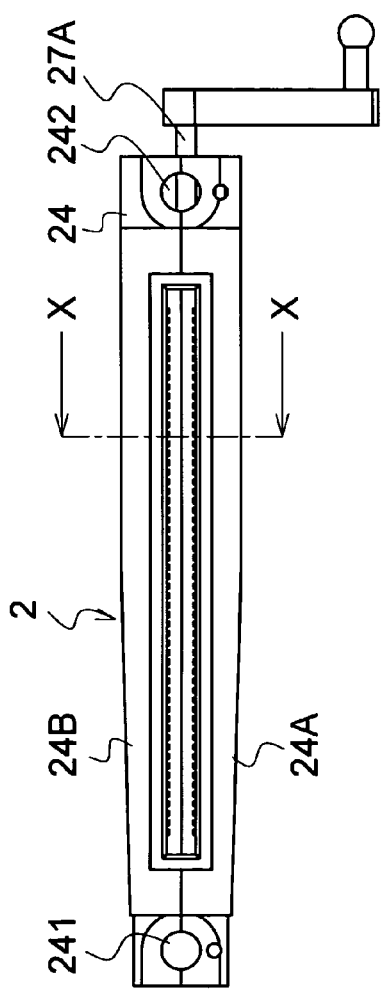
Figure 2:
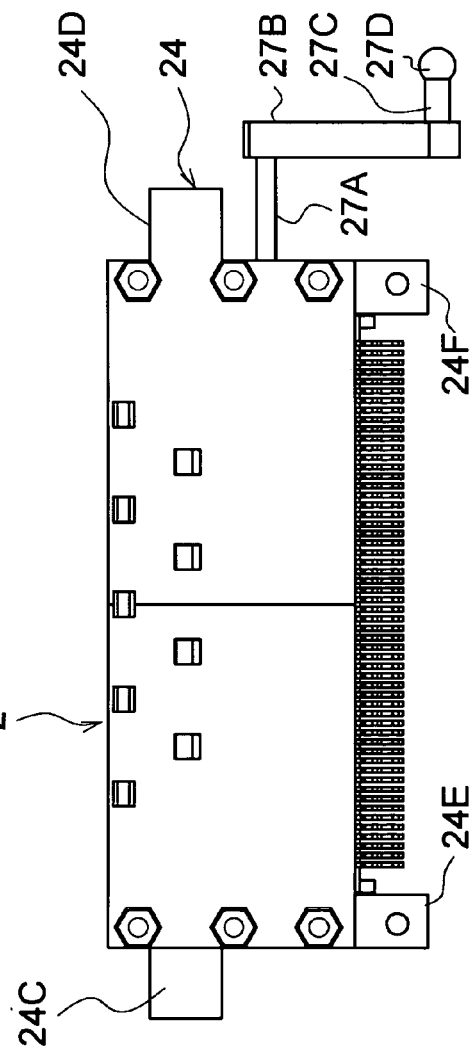

Best modes for carrying out the present invention will be described below in reference to the drawings.

FIGS. 1A and 1B are views showing an embodiment of a ZIF connector with an element plug according to the present invention (hereinafter referred to as "Connector" for short). In the drawings, FIG. 1A is a cross-sectional view showing the Connector 2 and a dual-in-line plug (hereinafter referred to as "Plug" for short) 1, a mating connector, which are placed opposite to each other; FIG. 1B is a side view showing the Connector 2 and Plug 1 placed opposite to each other.

In the embodiment shown by FIGS. 1A and 1B, the Plug 1 has a plurality of contacts 11A and 11B arrayed in two lines so as to be repulsive to each other. The Plug 1 is mounted on a test board 10. While only one Plug 1 is shown in the embodiment of FIGS. 1A and 1B, a plurality of the Plugs 1 are mounted on the test board 10.

On the other hand, the Connector 2 includes an opening 22 for insertion of the Plug 1 in its one end. Further, the Connector 2 has opposing contacts 21A and 21B inside the opening 22.

In the embodiment of FIGS. 1A and 1B, when the Plug 1 is inserted in and drawn from the opening 22, the contacts 21A and 21B are opened by a contact open-and-close mechanism, which is to be described later. When the contact open-and-close mechanism closes the contacts 21A and 21B, the contacts 21A and 21B are electrically connected with the contacts 11A and 11B of the Plug 1.

In the embodiment of FIGS. 1A and 1B, the Connector 2 is mounted on the fixture board 20. While only one Connector 2 is illustrated in the embodiment of FIGS. 1A and 1B, a plurality of Connectors 2 are mounted on the fixture board 20 in a radial pattern (or in a radial manner) actually.

The moving block 23 in the embodiment of FIGS. 1A and 1B is made from an insulative synthetic resin and shaped into a general rectangular form. In addition, the moving block 23 cantilevers the opposing contacts 21A and 21B so that one end of the contacts 21A and 21B can open in a form of the character V. The moving block 23 is moved forward and backward with respect to the opening 22 by the above-described contact-opening mechanism.

The shell 24 made from a light-weight, hard metal slidably houses the moving block 23 with contacts 21A and 21B. The shell 24 is split into a first sub-shell 24A and a second sub-shell 24B so that they are half of the thickness of the shell 24.

A first insulative guide block 25 is attached on the entrance of the opening 22. The first guide block 25 has a pair of inclined faces 25A and 25B formed in positions opposite from each other. The pair of inclined faces 25A and 25B has a certain inclination angle so that the distance therebetween gradually widens from inside the opening 22 toward outside the opening 22. The pair of inclined faces 25A and 25B guides the one end of the contacts 21A and 21B.

Moreover, in the embodiment of FIGS. 1A and 1B, when the contact open-and-close mechanism moves the moving block 23 with the contacts 21A and 21B toward the opening 22, the one opposing end of the contacts 21A and 21B slide on the pair of inclined faces 25A and 25B of the first guide block 25, making the opposing distance between the one end of the contacts 21A and 21B larger than the distance between the contacts 11A and 11B of the Plug 1.

In the meantime, the Connector 2 in the embodiment of FIGS. 1A and 1B has one end with the opening 22 and the other end opposite from the one end; a printed circuit board 30 is held on the other end of the Connector 2. The printed circuit board 30 has edge connectors 31A and 31B (or edge connector terminals) making external connection terminals on its front and rear surfaces. The contacts 21A and 21B of the Connector 2 are electrically connected with the edge connectors 31A and 31B.

Further, in the embodiment of FIGS. 1A and 1B, a second insulative guide block 26 is attached on the other end of the Connector 2 opposite from the opening 22. The second guide block 26 has a pair of inclined faces 26A and 26B formed in positions opposite from each other. The pair of inclined faces 26A and 26B has a certain inclination angle so that the distance therebetween gradually widens from outside the other end of the Connector 2 toward inside the other end. The pair of inclined faces 26A and 26B guides the other end opposite from the one end of the contacts 21A and 21B.

Further, in the embodiment of FIGS. 1A and 1B, the moving block 23 is arranged so that the opposing other end of the contacts 21A and 21B protrude from the shell 24. The moving block 23 also cantilevers the opposing contacts 21A and 21B so that the opposing other end of the contacts 21A and 21B can be closed in a form of the character V.

In the embodiment of FIGS. 1A and 1B, when the contact open-and-close mechanism moves the moving block 23 with the contacts 21A and 21B toward the opening 22, the opposing other end of the contacts 21A and 21B slide on the pair of inclined faces 26A and 26B of the second guide block 26. Then, the opposing other end of the contacts 21A and 21B, which have been in contact with the edge connectors 31A and 31B, are opened so that they are spaced away from the edge connectors 31A and 31B.

Now, the structure of the Connector 2 illustrated in FIGS. 1A and 1B will be further described in detail in reference to FIGS. 2A–2D. Of the drawings, FIG. 2A is a front view of the Connector 2; FIG. 2B is a top view of the Connector 2; FIG. 2C is a left-side view taken from the left side of the Connector 2 in FIG. 2A; and FIG. 2D is a cross-sectional view taken along the line X—X in FIG. 2A.

In the embodiment of FIGS. 2A–2D, the moving block 23 has a rectangular through-hole 23K formed in parallel with the direction in which the above-described second contacts are arranged, as best shown in FIG. 2D. In the rectangular through-hole 23K, there is inserted an eccentric cam 27. The eccentric cam 27 and moving block 23 constitute a cam unit.

In the embodiment of FIGS. 2A–2D, the rotation axis 27A of the eccentric cam 27 protrudes from the shell 24 and a lever 27B is attached on an axial end of the rotation axis 27A. On an end of the lever 27B in a radial direction is attached a handle 27C. On a leading end portion of the handle 27C, there is provided a spherical control 27D.

In the embodiment of FIGS. 2A–2D, Q is a rotation center of the eccentric cam 27. As shown in FIG. 2D, the rotation center Q of the eccentric cam 27 is located at a position with its lift lower than a central line of line symmetry with respect to the Connector 2 by the distance "t." As shown in FIG. 2C, the lever 27B can be counterclockwise rotated by an angle of 45 degrees. As described above, the Connector 2 includes a contact open-and-close mechanism which can swing the lever 27B thereby to move the moving block 23 forward and backward.

As shown in the embodiment of FIGS. 2A–2D, the first sub-shell 24A and second sub-shell 24B, formed as separate structures, are assembled into a shell 24. The separately-formed first sub-shell 24A and second sub-shell 24B are fastened to each other and integrated by fastening means composed of screws and nuts.

The shell 24 thus assembled has a pair of flanges (or brims) 24C and 24D formed on both sides in its lengthwise direction. The paired flanges 24C and 24D have threaded holes 241 and 242 for fixing the Connector 2, respectively.

Further, the Connector 2 has a U-shaped flanges 24E and 24F for attaching a printed circuit board 30 (see FIGS. 1A and 1B) formed in left and right lower end portions of the Connector 2.

In the embodiment of FIGS. 2A–2D, the moving block 23 is composed of two moving block parts 23A and 23B line-symmetrical with respect to each other. The moving block parts 23A and 23B hold contacts 21A and 21B respectively. Incidentally, the moving block part 23A with the contacts 21A and the moving block part 23B with the contacts 21B are just differentiated for the sake of convenience, and the moving block parts are identical with each other.

In the embodiment of FIGS. 2A–2D, the moving block part 23A with the contacts 21A and moving block part 23B with the contacts 21B are combined into the moving block and slidably housed by the shell 24. Inside the split rectangular through-hole 23K, a pair of long plates 231 is placed so that the paired long plates cover opposing inner walls of the through-hole in a direction perpendicular to the direction of the movement of the moving block 23. The eccentric cam 27 is slidably coupled to the long plates 231 placed oppositely.

Next, the structure of the first sub-shell 24A will be described in reference to FIGS. 3A–3F. Of the drawings, FIG. 3A is a front view of the first sub-shell 24A; FIG. 3B is a top view of the first sub-shell 24A; and FIG. 3C is a left-side view taken from the left side of the first sub-shell 24A in FIG. 3A. In addition, FIG. 3D is a rear view of the first sub-shell 24A, and FIG. 3E is a bottom view of the first sub-shell 24A. FIG. 3F is a cross-sectional view of the first sub-shell 24A taken along the line X—X in FIG. 3E.

In FIGS. 3A–3F, the opening 22 is formed in its divided form. Also, the paired flanges 24C and 24D are formed in their divided form. Further, the threaded holes 241 and 242 and the flanges 24E and 24F are formed in respective divided forms, too.

As shown in FIG. 3B, the first sub-shell 24A has a plurality of holes 243 formed therein, wherein the holes run from the inner wall to the outer surface thereof through the shell. The holes 243 can be mated with protrusions 253 formed on the first guide block 25, which are to be described later. Further, the first sub-shell 24A has a sloping portion 244 formed in its outer wall. The sloping portion 244 is intended to make the thickness of one end of the shell 24 thinner than that of the other end in combination with a sloping portion 246 formed on the second sub-shell 24B, which is to be described later.

Now, the structure of the second sub-shell 24B will be described in reference to FIGS. 4A–4F. Of the drawings, FIG. 4A is a front view of the second sub-shell 24B; FIG. 4B is a top view of the second sub-shell 24B of the FIG. 4A; and FIG. 4C is a left-side view taken from the left side of the second sub-shell 24B in the FIG. 4A. Further, FIG. 4D is a rear view of the second sub-shell 24B. FIG. 4E is a bottom view of the second sub-shell 24B. FIG. 4F is a cross-sectional view of the second sub-shell 24B taken along the line X—X in FIG. 4E.

In FIGS. 4A–4F, the opening 22 is formed in its divided form. Also, the paired flanges 24C and 24D are formed in their divided form. Further, the threaded holes 241 and 242 and the flanges 24E and 24F are formed in respective divided forms, too.

As shown in FIG. 4B, the second sub-shell 24B has a plurality of holes 245 formed therein, wherein the holes run from the inner wall to the outer surface thereof through the shell. The holes 245 can be mated with protrusions 255 formed on the first guide block 25, which are to be described later. Further, the second sub-shell 24B has a sloping portion 246 formed in its outer wall. The sloping portion 246 is intended to make the thickness of one end of the shell 24 thinner than that of the other end in combination with the above-described sloping portion 244 formed on the first sub-shell 24A.

FIGS. 5A–5C are views showing the moving block part 23A with the contacts 21A. Of the drawings, FIG. 5A is a front view of the moving block part 23A with the contacts 21A; FIG. 5B is a top view of the moving block part 23A with the contacts 21A of FIG. 5A; and FIG. 5C is a left-side view taken from the left side of the moving block part 23A with the contacts 21A in FIG. 5A.

In the embodiment of FIGS. 5A–5C, a plurality of contacts 21A are provided by molding in the insulative moving block part 23A. As described above, the moving block part 23A with the contacts 21A is identical with the moving block part 23B with the contacts 21B. Therefore, it can be also the that a plurality of contacts 21B are provided by molding in the insulative moving block part 23B.

Figure 6:
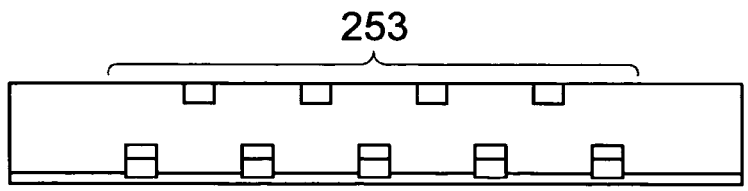
FIGS. 6A–6E are views showing a structure of a first guide block according to the present invention.
Figure 6:
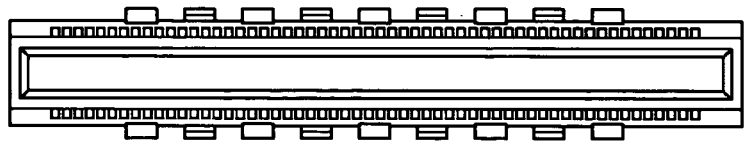
Figure 6:
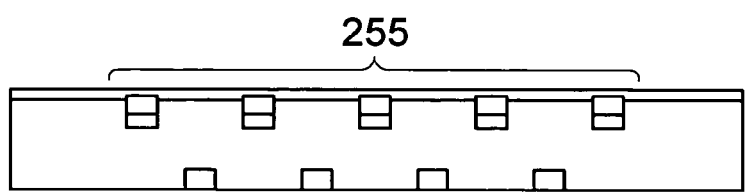
Figure 6:
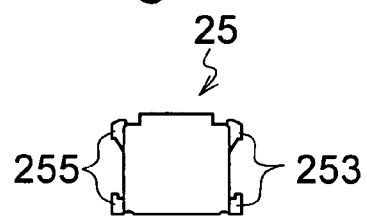
Figure 6:
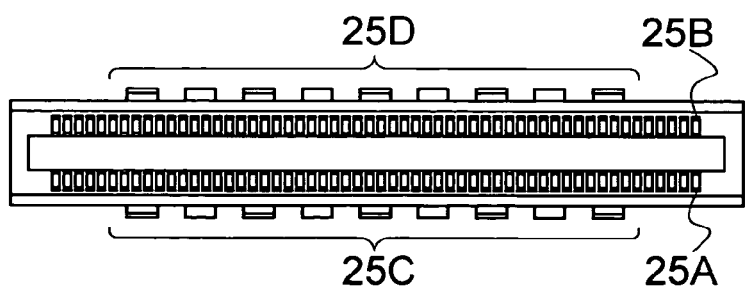

Now, the structure of the first guide block 25 will be described in reference to FIGS. 6A–6E. Of the drawings, FIG. 6A is a front view of the first guide block 25; FIG. 6B is a top view of the first guide block 25; and FIG. 6C is a left-side view taken from the left side of the first guide block 25 in FIG. 6A. In addition, FIG. 6D is a rear view of the first guide block 25 of FIG. 6B. FIG. 6E is a bottom view of the first guide block 25.

As best shown in FIG. 6E, in the paired opposing inclined faces 25A and 25B (see FIGS. 1A and 1B) of the first guide block 25 are formed a plurality of pectinated grooves 25C and 25D, which are opposing mutually. The opposing pectinated grooves 25C and 25D are intended to guide opposing one end of the contacts 21A and 21B.

Further, as shown in FIGS. 6A–6E, on opposing side surfaces of the first guide block 25 are formed protrusions 253 and 255 for fitting into the holes 243 (see FIGS. 3A–3F) formed in the first sub-shell 24A and the holes 245 (see FIGS. 4A–4F) formed in the second sub-shell 24B.

Next, the structure of the second guide block 26 will be described in reference to FIGS. 7A–7C. In the drawings, FIG. 7A is a front view of the second guide block 26; FIG. 7B is a top view of the second guide block 26; and FIG. 7C is a right-side view taken from the right side of the second guide block 26 in FIG. 7A.

As shown in the embodiment of FIGS. 7A–7C, the opposing other end of the contacts 21A and 21B (see FIGS. 1A and 1B) abut against a pair of opposing outer walls 261 and 262 of the second insulative guide block 26. In the paired opposing outer walls 261 and 262, a plurality of pectinated grooves 26C and 26D are respectively formed so that they are opposite to the other ones. The plurality of pectinated grooves 26C and 26D are intended to guide the opposing other end of the contacts 21A and 21B.

Now, the structure of the Plug 1 shown in FIGS. 1A and 1B will be further described in detail in reference to FIGS. 8A–8E. Of the drawings, FIG. 8A is a front view of the Plug 1; FIG. 8B is a top view of the Plug 1; FIG. 8C is a left-side view taken from the left side of the Plug 1 in FIG. 8A; FIG. 8D is a rear view of the Plug 1; and FIG. 8E is a cross-sectional view taken along the line X—X in FIG. 8A.

In the embodiment of FIGS. 8A–8E, the insulative housing 12 has a thin plate-type head portion 12A. The Plug 1 has terminals for upright providing the contacts 11A and 11B held on both side surfaces of the head portion 12A. Further, terminals for laterally providing the contacts 11A and 11B are bonded with solder to lands on the test board 10 (see FIGS. 1A and 1B) or are brought into contact with the lands and electrically connected thereto.

In regard to the Plug 1 illustrated in FIGS. 8A–8E, there is prepared a reinforcing plate 13. When the Plug 1 is attached to the test board 10 illustrated in FIG. 1A, the Plug 1 is fixed by special bolts 14 and nuts with the reinforcing plate 13 interposed therebetween.

Figure 9:
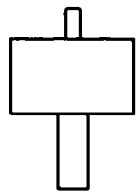
FIGS. 9A–9E are views showing a structure of the housing illustrated in FIGS. 8A–8E.
Figure 9:
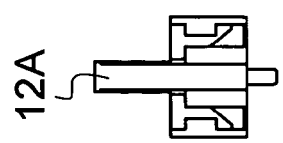
Figure 9:
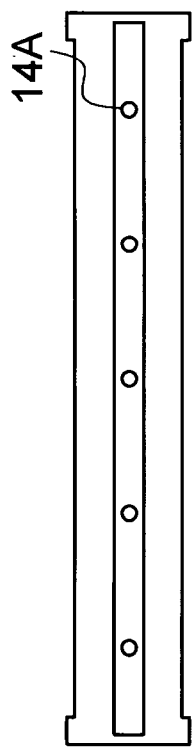
Figure 9:
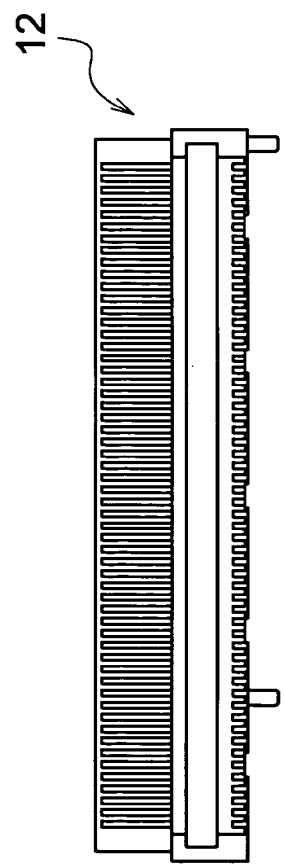
Figure 9:
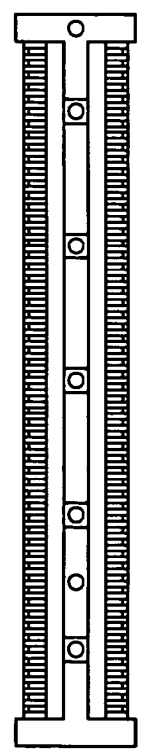

Next, the structure of the housing 12 illustrated in FIGS. 8A–8E will be described in reference to FIGS. 9A–9E. Of the drawings, FIG. 9A is a front view of the housing 12; FIG. 9B is a top view of the housing 12; FIG. 9C is a right-side view taken from the right side of the housing 12 in FIG. 9B; FIG. 9D is a rear view of the housing 12; and FIG. 9E is a cross-sectional view of the housing 12 in FIG. 9A.

As shown in FIGS. 9A–9E, there are formed a plurality of grooves for holding the terminals for upright providing the contacts 11A and 11B (see FIGS. 8A–8E) on both side surfaces of the head portion 12A. Then, the contacts 11A and 11B are press-fit in the grooves. In addition, along a central line of the head portion 12A, there are formed a plurality of through-holes 14A in which the special bolts 14 (see FIGS. 8A–8E) are inserted.

Next, the effect of the Connector 2 according to the present invention will be described in reference to FIGS. 10A–10F. FIGS. 10A–10F are cross-sectional views of the Connector 2, showing changes in the condition of the Connector.

Figure 10:
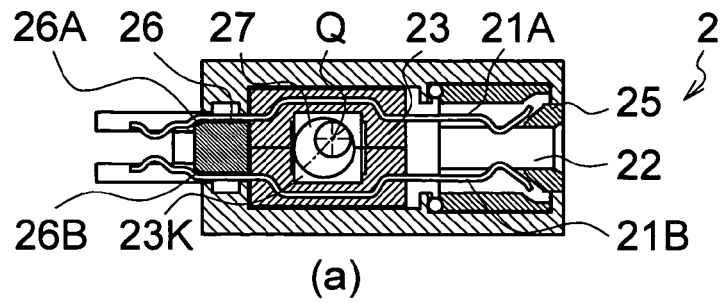
FIGS. 10A–10F are cross-sectional views of assistance in explaining the effect of the ZIF connector according to the present invention, showing changes in the condition of the connector.
Figure 10:
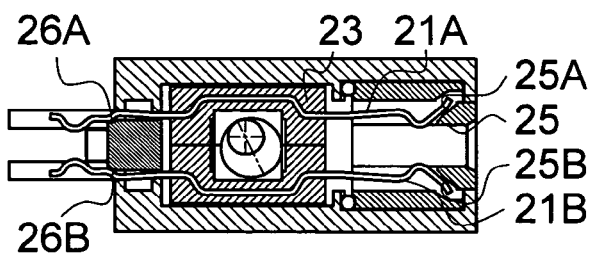
Figure 10:
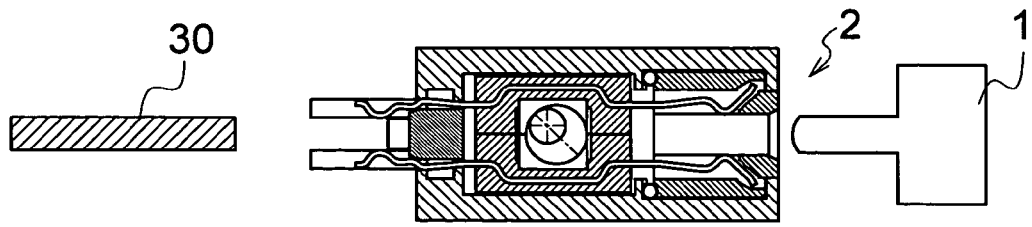
Figure 10:
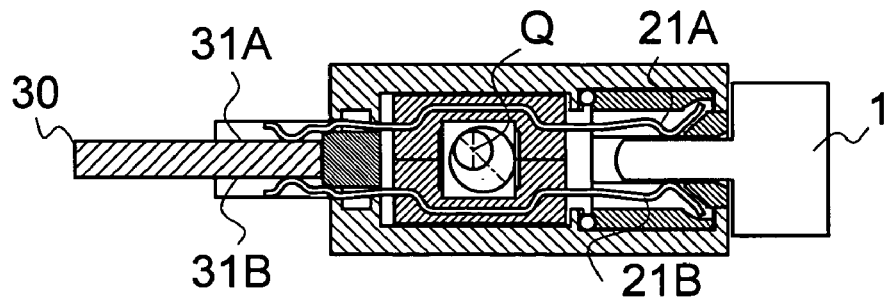
Figure 10:
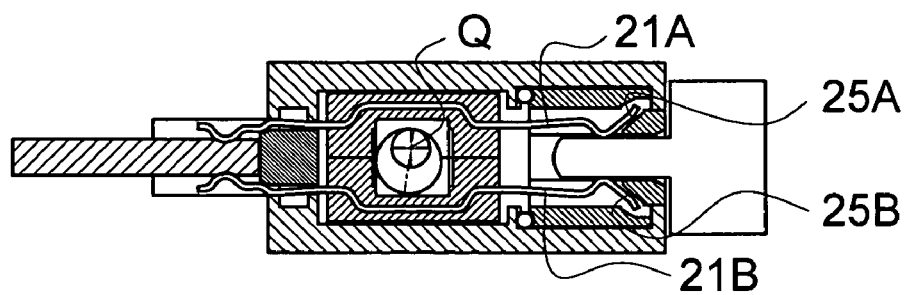
Figure 10:
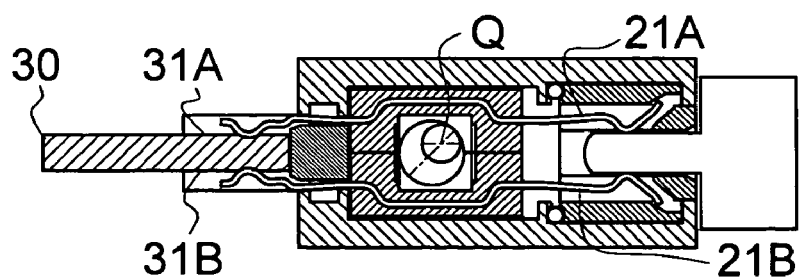

FIG. 10A shows the condition where the opposing contacts 21A and 21B are closed and the outline of the eccentric cam 27 abuts on the left wall of the rectangular through-hole 23K. When the rotation center Q of the eccentric cam 27 is rotated counterclockwise in the condition shown by FIG. 10A, the Connector 2 is brought into the condition shown by FIG. 10B.

In the condition shown by FIG. 10B, the contacts 21A and 21B have been driven rightward together with the moving block 23 following the movement of the outline of the eccentric cam 27. In the condition shown by FIG. 10B, the opposing one end of the contacts 21A and 21B have slid on the pair of inclined faces 25A and 25B of the first guide block 25 and thus the opposing distance between the one end of the contacts 21A and 21B has been widened.

When the rotation center Q of the eccentric cam 27 is further rotated counterclockwise in the condition shown by FIG. 10B, the Connector 2 is brought into the condition shown by FIG. 10C. In the condition shown by FIG. 10C, the opposing distance between the one end of the contacts 21A and 21B has been further widened and made larger than the distance between the contacts 11A and 11B of the Plug 1 (see FIGS. 1A and 1B).

In the process during which the condition of the Connector 2 is changed from the condition shown by FIG. 10A to the condition shown by FIG. 10C, the opposing other end of the contacts 21A and 21B slide on the pair of inclined faces 26A and 26B of the second guide block 26 and thus the distance between the opposing other end of the contacts 21A and 21B is widened.

Incidentally, the printed circuit board 30 is attached to the Connector 2 from the start. However, the printed circuit board 30 and Connector 2 are separately illustrated in FIG. 10C in order to show that the printed circuit board 30 can be easily inserted in the Connector 2.

FIG. 10D shows the condition where the Plug 1 has been inserted into the Connector 2 in the condition shown by FIG. 10C. When the Plug 1 is inserted into the Connector 2 under the condition shown by FIG. 10C, the contacts 21A and 21B do not contact with the Plug 1. Therefore, little force is required in order to insert the Plug 1.

When the rotation center Q of the eccentric cam 27 is rotated clockwise in the condition shown by FIG. 10D, the Connector 2 is brought into the condition shown by FIG. 10E. In the condition illustrated in FIG. 10E, the contacts 21A and 21B have been driven leftward together with the moving block 23 following the movement of the outline of the eccentric cam 27.

Also, in the condition shown by FIG. 10E, the opposing one end of the contacts 21A and 21B have slid on the pair of inclined faces 25A and 25B of the first guide block 25 to narrow the opposing distance between the one end of the contacts 21A and 21B.

When the rotation center Q of the eccentric cam 27 is further rotated clockwise in the condition shown by FIG. 10E, the Connector 2 is brought into the condition shown by FIG. 10F. In the condition illustrated in FIG. 10F, the opposing distance between the one end of the contacts 21A and 21B has been restored, and the one end of the contacts 21A and 21B have been correctly brought into contact with the corresponding contacts 11A and 11B of the Plug 1 (see FIGS. 1A and 1B).

On the other hand, in the condition shown by FIG. 10D, the opposing other end of the contacts 21A and 21B have slid on the pair of inclined faces 26A and 26B of the second guide block 26 and have been widened in the distance therebetween. In this situation, the other end of the contacts 21A and 21B have not been in contact with the edge connectors 31A and 31B formed on the printed circuit board 30 yet.

In the condition shown by FIG. 10F, the opposing other end of the contacts 21A and 21B have been restored and correctly brought into contact with the edge connectors 31A and 31B.

Figure 11:
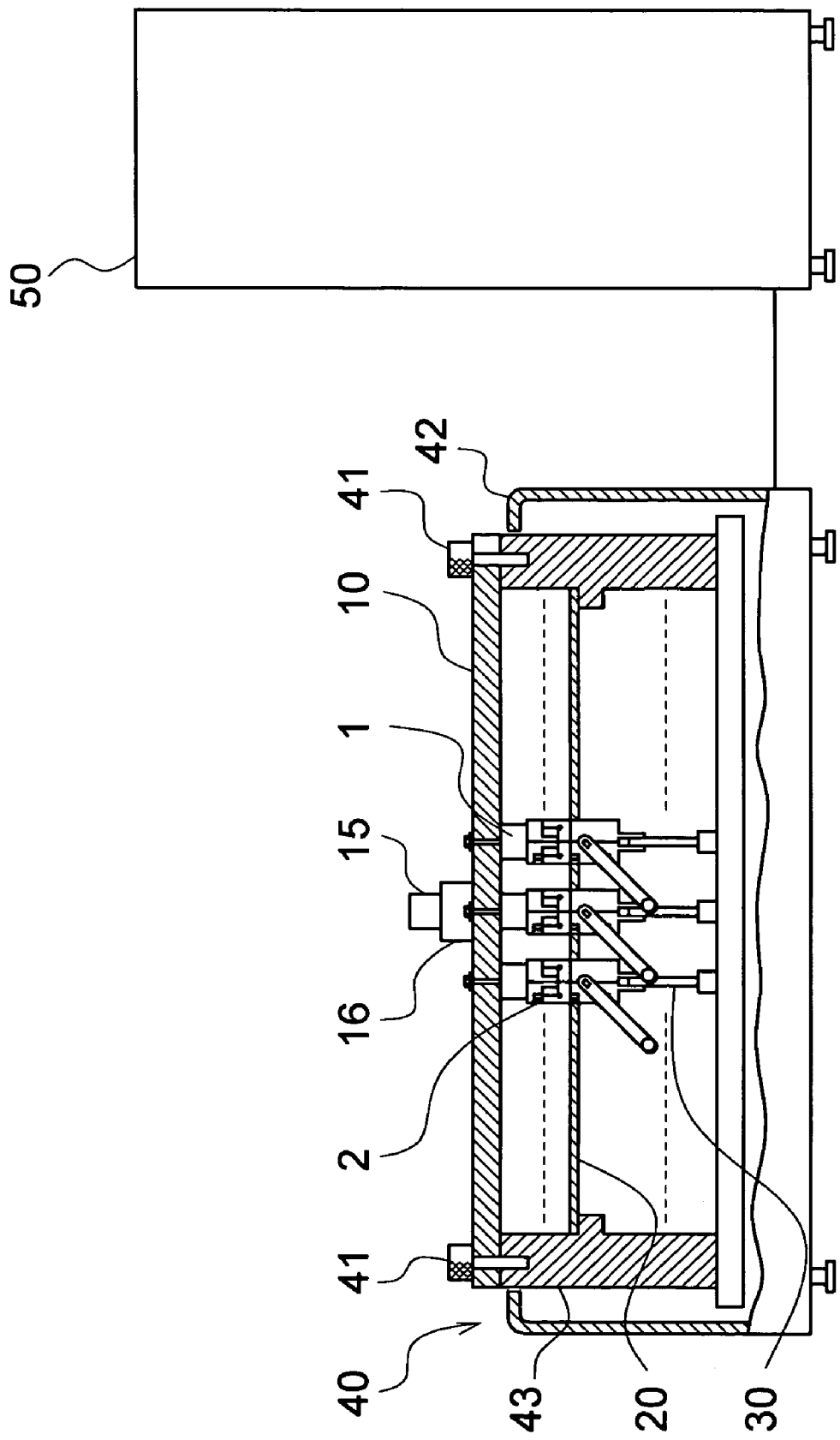
FIG. 11 is a front view showing an arrangement of a semiconductor-testing apparatus according to the present invention.

Next, the configuration of a semiconductor-testing apparatus according to the present invention will be described in reference to FIG. 11. In the front view of FIG. 11, an upper portion of a testing head 40 is illustrated in a longitudinal section. As shown in FIG. 11, the semiconductor-testing apparatus 50 includes the testing head 40. The semiconductor-testing apparatus 50 and testing head 40 are electrically connected to each other, for example, by a cable.

In FIG. 11, the test board 10 is placed in the upper portion of the testing head 40. On the upper surface of the test board 10 is placed an IC socket 16. A DUT 15 is to be set in the IC socket 16 and then tested electrically. The test board 10 has a plurality of Plugs 1 mounted on its lower surface. The IC socket 16 is electrically connected with the Plugs 1 through the test board 10.

In FIG. 11, a fixture board 20 is placed between the test board 10 and testing head 40. On the upper surface of the fixture board 20 is mounted a plurality of Connectors 2. The plurality of Plugs 1 placed on the lower surface of the test board 10 are to be mated and unmated with the plurality of Connectors 2 on the fixture board 20.

In FIG. 11, test board 10 and fixture board 20 are circular, and the Plugs 1 and Connectors 2 are arranged in radial patterns respectively. In the drawing, only some of the Plugs 1 and Connectors 2 are illustrated, and the other Plugs and Connectors are omitted here.

The test board 10 is fixed on the upper surface of the cylindrical frame 43 by screws 41. If the screws 41 are unscrewed, another test board 10 can be attached to the testing head 40 instead. The frame 43 is covered by a cover 42.

The semiconductor-testing apparatus 50 receives and transmits electrical signals through the printed circuit board 30, Connector 2, test board 10, and IC socket 16 with respect to the DUT 15 and then the DUT 15 is tested electrically.

Figure 12:
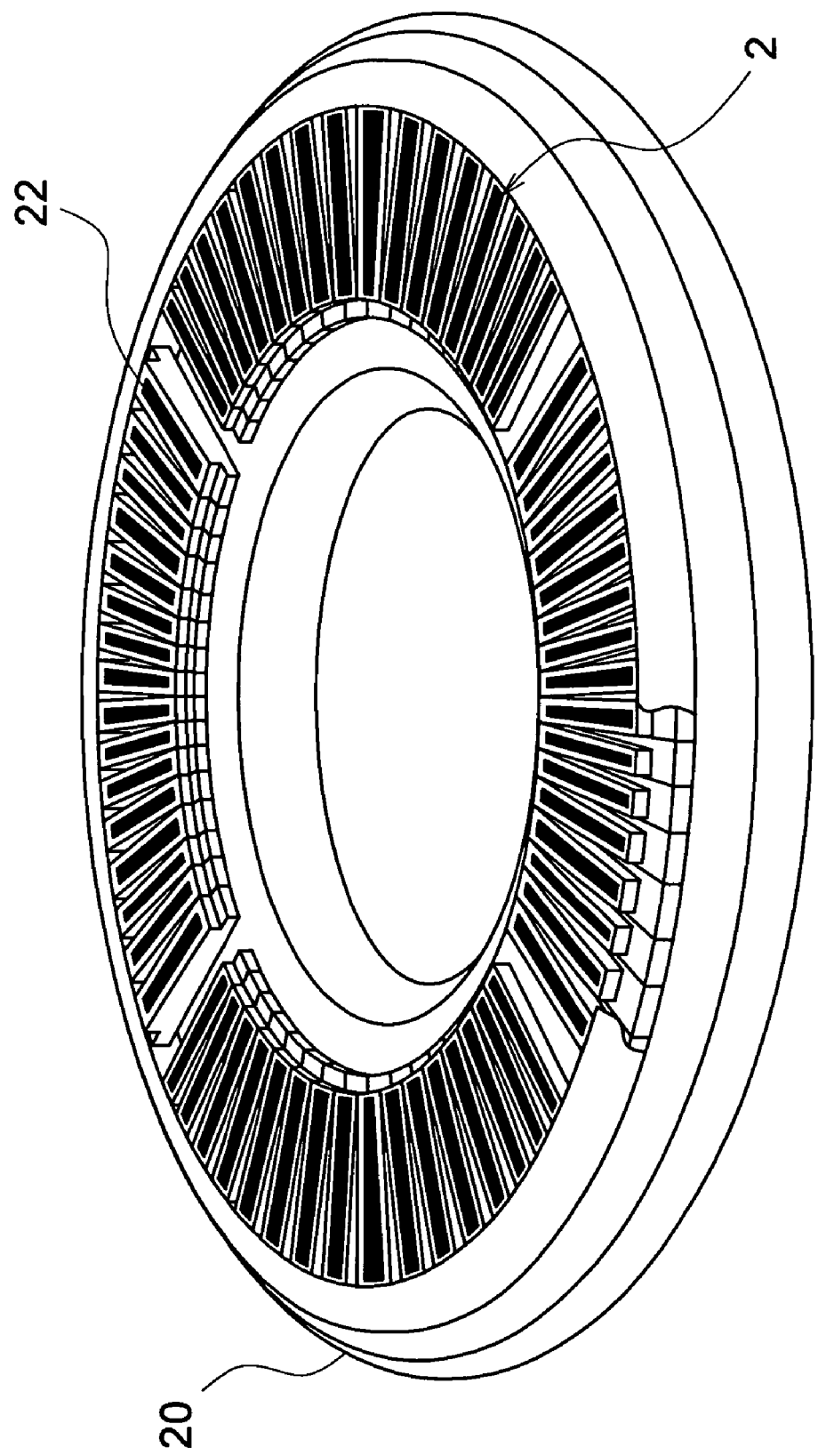
FIG. 12 is a perspective outline view of a fixture board according to the present invention.

FIG. 12 is a perspective outline view of the fixture board 20 illustrated in FIG. 11. As shown in FIG. 12, a plurality of Connectors 2 are mounted on a central portion of the fixture board 20 in a radial pattern. In FIG. 12, each shell 24 (see FIGS. 3A–3F) is placed on the fixture board 20 with one end of a smaller thickness pointed toward the center of the radial pattern and the other end of a larger thickness pointed toward the circumference of the pattern.

Sloping portions 244 and 246 (see FIGS. 3A–3F and FIGS. 4A–4F) are provided in one end of the shell 24 to make the one end of the shell 24 thinner than the other end thereof in this manner, which allows a larger number of Connectors 2 to be placed on the fixture board 20.

While a low-profile ZIF connector according to the present invention, which is suitable to be arranged in a radial pattern in a testing head with a semiconductor-testing apparatus, has been described, the present invention is not so limited. For example, when a flange of the shell for mounting the ZIF connector may be appropriately modified, it also becomes possible to mount a plurality of ZIF connectors lengthwise and crosswise. Incidentally, it is needless to say that the ZIF connector can be used independently.

A ZIF connector according to the present invention described above is intended to mate with a dual-in-line plug with two-line contacts. However, according to the technical idea of the present invention, the ZIF connector according to the present invention may be mated with a printed circuit board having an edge connector formed thereon and may be mated with a flexible flat cable such as FPC and FFC.

What is claimed is:

1. A ZIF connector comprising a connector element including a shell being provided with a first opening through which an element plug of a dual-in-line plug is to be inserted and to be removed; and second contacts opposing each other such that the second contacts pinch the element plug of the dual-in-line plug so as to make contact with the element plug inside the shell, the connector element further comprising:
    an insulative moving block movable in a direction of inserting and removing the dual-in-line plug inside the shell, the moving block holding the second contacts in a cantilever manner so that an extending portion of each of the second contacts extends from the moving block toward the first opening;
    a contact open-and-close mechanism for driving the moving block in the direction of inserting and removing; and
    a first insulative guide block being disposed inside the shell and including inclined faces, each of the inclined faces having a predetermined angle with respect to the direction of inserting and removing so as to allow a sliding portions to slide thereon, the sliding portion being provided on at least part of each of the extending portion,
    wherein when the element plug of the dual-in-line plug is inserted or removed, the moving block is moved toward the first opening by the contact open-and-close mechanism such that the respective sliding portions of the second contacts slide on the respective inclined faces of the first guide block, thereby widening a distance between the second contacts to allow the element plug of the dual-in-line plug to be inserted or removed from between the second contacts, and
    when insertion of the dual-in-line plug is completed, the moving block is moved away from the first opening by the contact open-and-close mechanism such that the respective sliding portions of the second contacts slide on the respective inclined faces of the first guide block, thereby narrowing the distance between the second contacts to allow the second contacts to pinch the dual-in-line plug.

2. The ZIF connector including the connector element according to claim 1, wherein the shell is provided with a second opening being, through which an edge connector terminal is inserted and removed, the connector element further comprising:
    third contacts opposing each other such that the third contacts pinch the edge connector terminal so as to make contact with the edge connector terminal inside the shell,
    the moving block holding the third contacts in a cantilever manner so that an extending portion of each of the third contacts extending from the moving block toward the second opening; and
    a second insulative guide block being disposed inside the shell and including inclined faces, each of the inclined faces having a predetermined angle with respect to the direction of inserting and removing so as to allow a sliding portion to slide thereon, the sliding portion being provided on at least part of each of the extending portion,
    wherein when the edge connector terminal is inserted or removed, the moving block is moved away from the second opening by the contact open-and-close mechanism such that the respective sliding portions of the third contacts slide on the respective inclined faces of the second guide block, thereby widening a distance between the third contacts to allow the edge connector terminal to be inserted or removed from between the third contacts, and
    when insertion of the edge connector terminal is completed, the moving block is moved toward the second opening by the contact open-and-close mechanism such that the respective sliding portions of the second contacts slide on the respective inclined faces of the second guide block, thereby narrowing the distance between the third contacts to allow the third contacts to pinch the edge connector terminal.

3. The ZIF connector including the connector element according to claim 1, wherein the contact open-and-close mechanism includes:
    a through-hole provided in the moving block in a direction substantially perpendicular to the direction of inserting and removing and substantially perpendicular to a direction of widening/narrowing the distance between the second contacts and the distance between the third contacts;
    an eccentric cam being provided inside the through-hole and having an eccentric rotation axis extending substantially in parallel with a piercing direction of the through-hole;
    a lever being coupled with and extending substantially perpendicular to the eccentric rotation axis of the eccentric cam, for turning the eccentric cam at least by a predetermined turning angle; and
    a bearing capable of rotatably fixing the eccentric rotation axis to the shell; and
    wherein when a cam surface of the eccentric cam abuts against a first face of the through-hole on a side of the first opening or against a second face of the through-hole on a side of the second opening, the moving block is moved toward the first or the second opening relative to the shell.

4. The ZIF connector including the connector element according to claim 2, wherein the contact open-and-close mechanism includes:
a through-hole provided in the moving block in a direction substantially perpendicular to the direction of inserting and removing and substantially perpendicular to a direction of widening/narrowing the distance between the second contacts and the distance between the third contacts;
an eccentric cam being provided inside the through-hole and having an eccentric rotation axis extending substantially in parallel with a piercing direction of the through-hole;
a lever being coupled with and extending substantially perpendicular to the eccentric rotation axis of the eccentric cam, for turning the eccentric cam at least by a predetermined turning angle; and
a bearing capable of rotatably fixing the eccentric rotation axis to the shell, and
wherein when a cam surface of the eccentric cam abuts against a first face of the through-hole on a side of the first opening or against a second face of the through-hole on a side of the second opening, the moving block is moved toward the first or the second opening relative to the shell.

5. The ZIF connector including the connector element according to claim 1, wherein the first guide block further includes a wall for restricting deformation of the second contacts substantially in parallel with the eccentric rotation axis.

6. The ZIF connector including the connector element according to claim 2, wherein the first guide block further includes a wall for restricting deformation of the second contacts substantially in parallel with the eccentric rotation axis.

7. The ZIF connector including the connector element according to claim 2, wherein the second guide block further includes a wall for restricting deformation of the third contacts substantially in parallel with the eccentric rotation axis.

8. The ZIF connector including the connector element according to claim 1, wherein the moving block is constituted of dividing parts, into which the moving block can be split with respect to a splitting plane substantially in parallel with the direction of inserting and removing and the direction of the eccentric rotation axis.

9. The ZIF connector including the connector element according to claim 2, wherein the moving block is constituted of dividing parts, into which the moving block can be split with respect to a splitting plane substantially in parallel with the direction of inserting and removing and the direction of the eccentric rotation axis.

10. The ZIF connector including the connector element according to claim 8, wherein each of the dividing parts is formed by molding.

11. The ZIF connector including the connector element according to claim 8, wherein the contact open-and-close mechanism further includes plates respectively abutting against the first and second faces of the through-hole, and the moving block is driven by abutting the surface of the cam against one of the plates.

12. The ZIF connector including the connector element according to claim 1, wherein the shell comprises dividing parts, into which the shell can be split with respect to a splitting plane substantially in parallel with the direction of inserting and removing and a direction of the eccentric rotation axis.

13. The ZIF connector including the connector element according to claim 12, wherein the first guide block includes protruding portions which engage with fitting holes provided in the dividing parts of the shell.

14. The ZIF connector including at least two of the connector elements according to claim 1, wherein the connector elements are disposed in a row and each of the connector elements comprising the moving block, the contact open-and-close mechanism, and the first guide block,
wherein the connector elements are disposed in the row such that the connector elements have the common eccentric rotation axis so as to allow the eccentric cams to operate in a common single phase such that the connector elements have the common direction of inserting and removing.

15. The ZIF connector including at least two of the connector elements according to claim 2, wherein the connector elements are disposed in a row and each of the connector elements comprising the moving block, the contact open-and-close mechanism, and the first guide block,
wherein the connector elements are disposed in the row such that the connector elements have the common eccentric rotation axis so as to allow the eccentric cams to operate in a common single phase such that the connector elements have the common direction of inserting and removing.

16. A ZIF connector group comprising a plurality of the inline-type ZIF connectors according to claim 14,
wherein each inline-type ZIF connector has gradually narrowing width from one end to the other thereof when the inline-type ZIF connector is viewed from the direction of inserting and removing, and
wherein the plurality of inline-type ZIF connectors are arranged on a plane in a radial manner so as to make a circular form with thinner end disposed in a vicinity of a center of the circular form.

17. A semiconductor-testing apparatus comprising a testing head, wherein:
the testing head includes: a test board, a surface of which a DUT can be set on; and a fixture board being disposed substantially in parallel with and opposing to another surface of the test board than the surface on which the DUT is to be set,
the test board including a plurality of dual-in-line plugs pointing to the fixture board, and
the fixture board holding the ZIF connector according to claim 12 wherein the ZIF connector includes a group of ZIF connectors so that the plurality of dual-in-line plugs can be connected with the respective ZIF connectors.

* * * * *